United States Patent
de Cremoux

(10) Patent No.: US 9,672,878 B1
(45) Date of Patent: Jun. 6, 2017

(54) MEMORY CIRCUIT

(71) Applicant: Dialog Semiconductor (UK) Limited, London (GB)

(72) Inventor: Guillaume de Cremoux, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/150,467

(22) Filed: May 10, 2016

(51) Int. Cl.
*G11C 7/10* (2006.01)

(52) U.S. Cl.
CPC ............ *G11C 7/109* (2013.01); *G11C 7/1063* (2013.01)

(58) Field of Classification Search
CPC ........ G11C 2211/4061; G11C 11/5621; G11C 11/5642; G11C 7/1078; G11C 7/109
See application file for complete search history.

(56) References Cited

U.S. PATENT DOCUMENTS

| | | | | |
|---|---|---|---|---|
| 5,757,719 A | * | 5/1998 | Calligaro | G11C 11/5621 365/185.33 |
| 2001/0008496 A1 | * | 7/2001 | Leung | G11C 11/406 365/223 |
| 2006/0018165 A1 | * | 1/2006 | Szczypinski | G11C 7/1078 365/189.05 |

* cited by examiner

*Primary Examiner* — Tuan T Nguyen
(74) *Attorney, Agent, or Firm* — Saile Ackerman LLC; Stephen B. Ackerman

(57) ABSTRACT

A memory circuit for storing a power failure event is presented. When a device restarts after a power supply failure, it usually resets its logic. This prevents the user from retrieving information relating to the power failure. The memory circuit comprises an input to receive a logic signal and an output to issue a logic value. The memory circuit also comprises a plurality of logic elements arranged such that upon powering the memory circuit, the output logic value has a greater probability of settling to a first logic value than a second logic value. Optionally, there is at least one memory element which comprises a first input and an output to issue a memory element logic value, wherein the memory element is operable between a first state in which the memory element logic value is zero and a second state in which the memory element logic value is one.

33 Claims, 5 Drawing Sheets

MEMORY CIRCUIT

TECHNICAL FIELD

The present disclosure relates to a memory circuit and in particular to a memory circuit for storing a power failure event.

BACKGROUND

In some circumstances, electrical devices may experience a power failure from the rail supply. When the device restarts after a power supply failure it usually resets its logic, hence losing any information relating to the supply failure potentially stored in the device. This prevents the user from retrieving information relating to the power failure.

SUMMARY

It is an object of the disclosure to address one or more of the above mentioned limitations. According to a first aspect of the disclosure there is provided a memory circuit comprising an input to receive a logic signal, and an output to output an output logic value; and a plurality of logic elements, the plurality of logic elements being arranged such that, upon powering the memory circuit, the output logic value has a greater probability of settling to a first logic value than a second logic value.

Optionally, the plurality of logic elements form at least one memory element, the memory element comprising a first input, and an output to output a memory element logic value; and wherein the memory element is operable between a first state in which the memory element logic value is zero and a second state in which the memory element logic value is one. Optionally, the memory circuit comprises a plurality of memory elements; and a logic gate comprising a plurality of inputs to receive the outputs of the plurality of memory elements and an output to output the output logic value.

Optionally, each one of the plurality of memory elements comprises a second input.

Optionally, the first input of a first memory element among the plurality of memory elements, is adapted to receive the logic signal, and the second input of the first memory element is adapted to receive a reset signal; and the first input of a second memory element among the plurality of memory elements, is adapted to receive the reset signal, and the second input of the second memory element is adapted to receive the logic signal.

Optionally, the logic gate comprises a least one inverted input among the plurality of inputs; and the output of the first memory element is connected to a non-inverted input of the logic gate and the output of the second memory element is connected to an inverted input of the logic gate.

Optionally, half of the plurality of inputs of the logic gate are inverted inputs and half of the plurality of inputs of the logic gate are non-inverted inputs.

Optionally, the logic gate comprises an AND gate.

Optionally, the memory elements are substantially identical.

Optionally, the memory element comprises at least one of a latch and a flip-flop.

Optionally, a memory element may be adapted such that upon power up the output of the memory element settles predominantly towards a specific logic value.

Optionally, the probability is greater than about 50%.

Optionally, the probability is greater than about 90%.

According to a second aspect of the disclosure there is provided an integrated circuit comprising a first domain adapted to be powered by a rail voltage, the first domain being adapted to output a logic signal upon failure of the rail voltage; and a second domain adapted to be powered by a battery; wherein the second domain comprises a memory circuit, adapted to receive the logic signal and to output a signal based on the logic signal;

wherein the memory circuit comprises an input to receive the logic signal, and an output to output an output logic value; and a plurality of logic elements, the plurality of logic elements being arranged such that, upon powering the memory circuit, the output logic value has a greater probability of settling to a first logic value than a second logic value.

Optionally, the plurality of logic elements form at least one memory element, the memory element comprising a first input, and an output to output a memory element logic value; and wherein the memory element is operable between a first state in which the memory element logic value is zero and a second state in which the memory element logic value is one.

Optionally, the memory circuit comprises a plurality of memory elements; and a logic gate comprising a plurality of inputs to receive the outputs of the plurality of memory elements and an output to output the output logic value.

Optionally, each one of the plurality of memory elements comprises a second input.

Optionally, the first input of a first memory element among the plurality of memory elements, is adapted to receive the logic signal, and the second input of the first memory element is adapted to receive a reset signal; and the first input of a second memory element among the plurality of memory elements, is adapted to receive the reset signal, and the second input of the second memory element is adapted to receive the logic signal.

Optionally, the first domain is adapted to output the reset signal.

Optionally, the logic gate comprises a least one inverted input among the plurality of inputs; and the output of the first memory element is connected to a non-inverted input of the logic gate and the output of the second memory element is connected to an inverted input of the logic gate.

According to a third aspect of the disclosure there is provided a method for providing a memory circuit comprising providing an input to receive a logic signal, and an output to output an output logic value; and arranging a plurality of logic elements, so that, upon powering the memory circuit, the output logic value has a greater probability of settling to a first logic value than a second logic value.

Optionally, the plurality of logic elements form at least one memory element, the memory element comprising a first input, and an output to output a memory element logic value; and wherein the memory element is operable between a first state in which the memory element logic value is zero and a second state in which the memory element logic value is one.

Optionally, the method comprises providing a plurality of memory elements; and a logic gate comprising a plurality of inputs to receive the outputs of the plurality of memory elements and an output to output the output logic value.

Optionally, each one of the plurality of memory elements comprises a second input.

Optionally, the first input of a first memory element among the plurality of memory elements, is adapted to receive the logic signal, and wherein the second input of the first memory element is adapted to receive a reset signal; and wherein the first input of a second memory element among the plurality of memory elements, is adapted to receive the reset signal, and wherein the second input of the second memory element is adapted to receive the logic signal.

Optionally, the logic gate comprises a least one inverted input among the plurality of inputs; and wherein the output of the first memory element is connected to a non-inverted input of the logic gate and wherein the output of the second memory element is connected to an inverted input of the logic gate.

Optionally, half of the plurality of inputs of the logic gate are inverted inputs and half of the plurality of inputs of the logic gate are non-inverted inputs.

Optionally, the logic gate comprises an AND gate.

Optionally, the memory elements are substantially identical.

Optionally, the memory element comprises at least one of a latch and a flip-flop.

Optionally, a memory element is adapted such that upon power up the output of the memory element settles predominantly towards a specific logic value.

Optionally, the probability is greater than about 50%.

Optionally, the probability is greater than about 90%.

BRIEF DESCRIPTION OF THE DRAWINGS

The invention is described in further detail below by way of example and with reference to the accompanying drawings, in which.

DESCRIPTION

Figure 1:
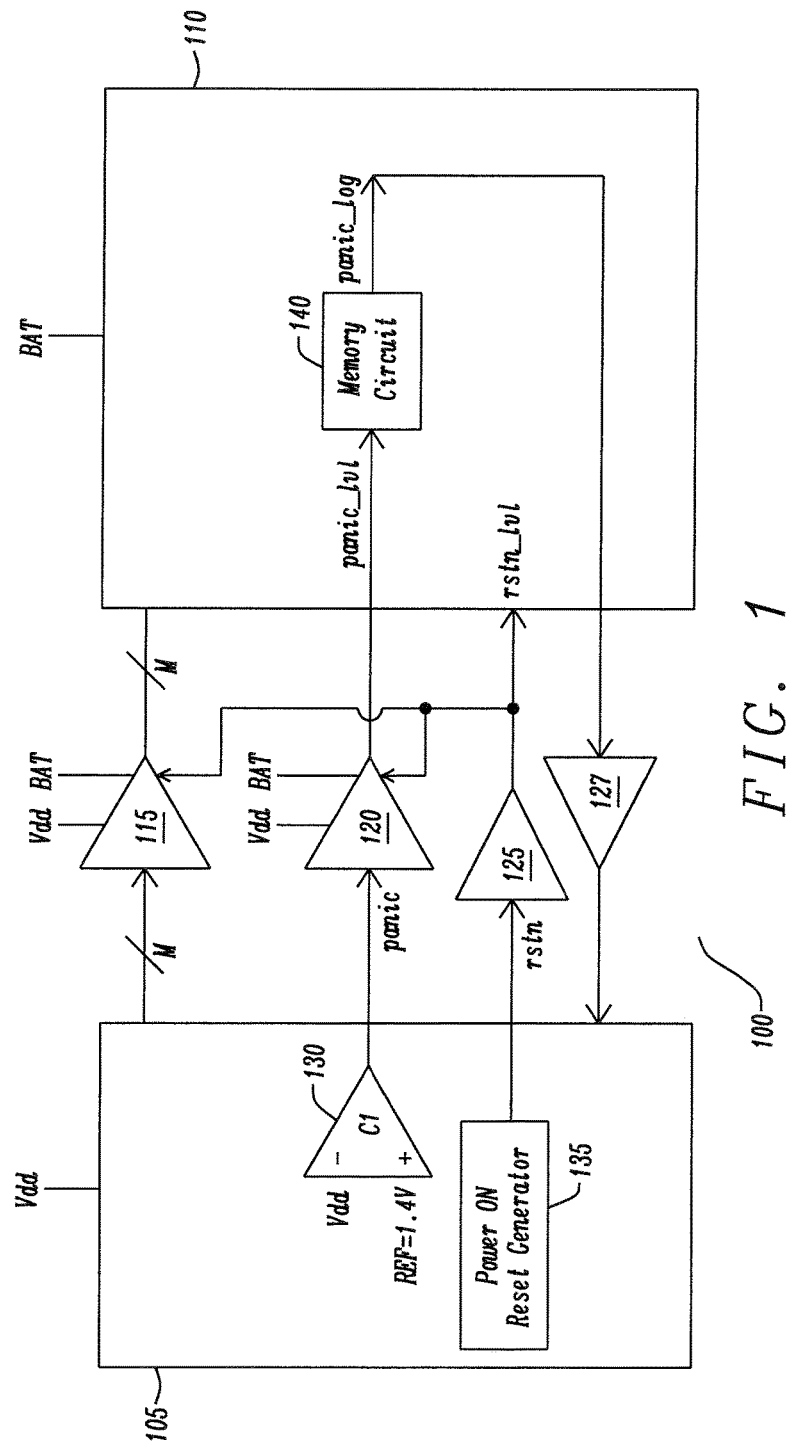
FIG. 1 is a diagram of a multi-domain power system.

FIG. 1 illustrates a multi-domain power system 100. The system comprises a first domain 105 powered by a rail voltage Vdd, also referred to as Vdd domain, and a second domain 110 powered by a battery voltage Vbat, also referred to as battery domain. The first domain 105 is coupled to the second domain 110 via a communication system or bus, comprising a plurality of level-shifters. For example, the system can have a number M of level shifters, including level shifters 115, 120, 125, 127. Each level shifter has an input for receiving a signal from one domain and an output for outputting a signal compatible with the other domain. The level shifter circuits 115, 120, 125 and 127 are powered by both the rail voltage Vdd and the battery voltage Vbat. The level shifter 115 and 120 are adapted to receive an output of the level shifter 125 such as a reset signal.

The first domain includes a level comparator 130 to generate a warning signal, also referred to as panic signal, upon identification of a rail voltage below a threshold value. The first domain also includes a power on reset POR generator 135 adapted to generate a reset signal. The second domain includes a memory circuit 140 to store information, such as a low level power event occurring in the first domain 105. The memory circuit 140 has one input for receiving the warning/panic signal; and one output for outputting an event signal, also referred to as panic_log signal. Optionally the memory circuit 140 may have another input, such as a reset pin, for receiving a reset signal. The first and the second domains are provided with other analog and digital circuitry, not shown.

In operation, digital signals generated by the first domain may be communicated to the second domain via the communication system. When the rail voltage falls below a certain level, for example a level below which the first domain 105 cannot operate properly, the comparator 130 outputs a warning signal. In an exemplary embodiment the rail voltage Vdd is expected to be 1.6 V. The comparator compares Vdd with a reference voltage for example set to 1.4 V. If Vdd is less than 1.4V the comparator outputs a warning/panic signal. The warning signal is communicated to the second domain 110 via the level shifter 120 and stored in the memory circuit 140. The level shifter 120 receives the warning/panic signal from the comparator 130 and outputs a warning signal, panic_lvl, that is compatible with the second domain 110. For example, the memory circuit 140 may be based on one or more latches or flip-flops.

In this way, when the first domain 105 recovers, it can read the warning signal and report occurrence of the voltage supply failure. Once the rail voltage supply Vdd is restored, the panic_log signal is fed back to the first domain 105 via the communication system. For example, the panic_log signal can drive a level-shifter, such as level shifter 127. This is made possible thanks to the fact that the memory circuit 140, was not reset via level shifter 125 as a result of the supply failure.

As long as the rail voltage is lower than a threshold value, for example 1V, a reset signal, for example a negative low is maintained by the power on reset generator 135.

Figure 2:
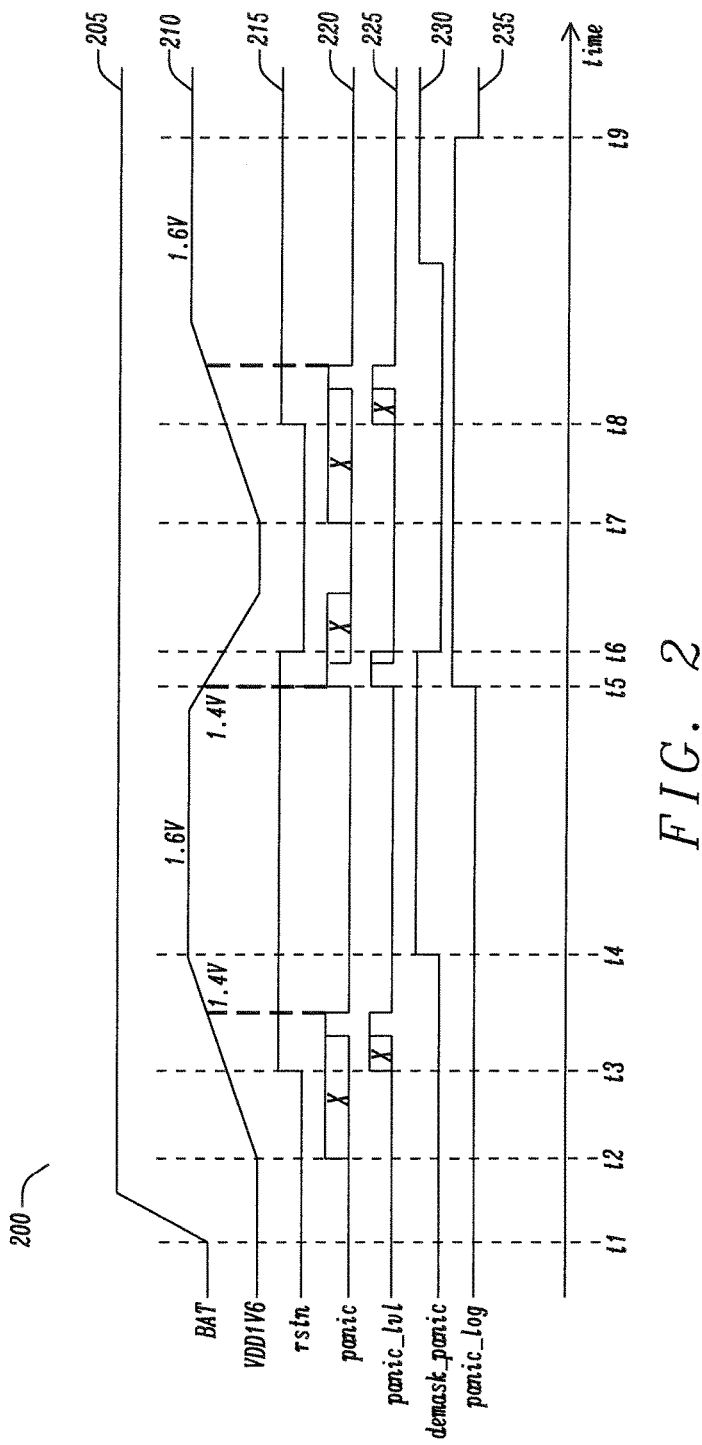
FIG. 2 is a timing chart illustrating the working of the power system of FIG. 1.

FIG. 2 illustrates a timing chart that includes the profiles of a battery voltage 205, a rail voltage Vdd 210, a power-on-reset signal 215, a warning signal also referred to as panic signal 220, a panic lvl signal 225, a demask_panic signal 230, and a panic log signal 235.

At time t1, the battery is ramped up. Once the battery has reached is maximum voltage it remains ON.

At time t2, the rail is ramped up.

Between times t2 and t3, the rail voltage 210 is still relatively low, for example less than 0.8 V, and the reset signal 215 is maintained at zero volts by the power on reset generator 135. The reset signal 215 is used to reset the level shifters 115 and 120. It can be observed that the panic-lvl signal 225 is maintained at zero when the reset signal 215 is zero.

At time t3 the reset signal 215 increases to a logic value of 1. At this point a portion of circuitry contained in the first domain 105 is well defined, while another portion of the first domain such as the comparator 130 remains undefined. For example, when the comparator 130 is powering up, it can give erroneous diagnosis before settling properly. This level of uncertainty over the output of the comparator 130 is illustrated by and error region labeled X on the panic signal 220 and the panic_lvl signal 225. In order to prevent spurious detections of the panic signal, the demask_panic signal 230 may be used to gate the output of the comparator 130. The demask signal is therefore used to prevent logging of an erroneous warning in the memory circuit 140.

At time t4, the rail voltage reaches its maximum value, for example 1.6V. At this point the system is in normal operation and can capture any panic event resulting from a power supply failure as illustrated by the following example. At time t4, the demask_panic signal increases to a logic value of 1. In practice a digital state-machine can be used to detect that the whole system has settled and can be used. At this point the demask signal takes the logic value one.

At time t5, the rail voltage drops under a threshold value, for example 1.4V. At this point, the comparator 130 sets its output to a logic 1. The panic signal is received at the second domain 110 via the level shifter 120. The information relating to a drop of voltage is stored in the memory circuit 140. The panic_log signal 235 increases to a logic value of 1 and remains stored in the second domain 110. As the rail voltage 210 continues to drop, the panic signal 220 becomes unreliable, since all the analog elements are no longer properly supplied.

At time t6, the reset signal decreases to a logic value of 0. As a result, the panic_lvl signal 225 vanishes. However, the panic_log signal 235 is saved in the second domain 110.

At time t7, the system starts recovering.

At time t8, the rail voltage reaches a certain voltage, allowing the system to read the panic_log signal 235 stored in the second domain 110. This allows a user to know that a failure of the rail supply has occurred.

At time t9, a software is used to reset the panic_log signal 235.

Figure 3:
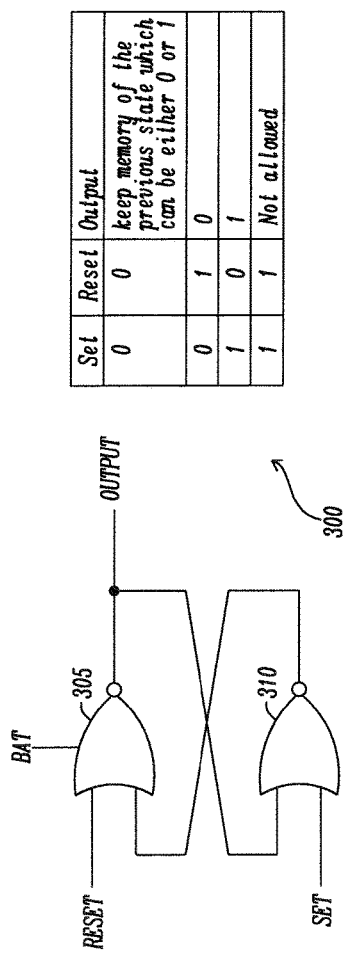
FIG. 3 is a diagram of a latch circuit.

FIG. 3 illustrates an example of a latch 300 having a first and a second input and one output. The latch 300 includes a first logic gate 305 and a second logic gate 310. Each one of the first and the second logic gates has two inputs and one output. The output of the first logic gate is connected to one of the two inputs of the second logic gate, and the output of the second logic gate is connected to one of the two inputs of the first logic gate. The remaining input of the first logic gate, corresponding to the first input of the latch, is adapted to receive a logic signal, for example a reset signal. The remaining input of the second logic gate, corresponding to the second input of the latch, is adapted to receive another logic signal, for example a set signal.

In the example of FIG. 3, the first logic gate 305 and the second logic gate 310 are provided by a NOR gate. In this case the outputs of the latch are as follows:

When both the set S and the reset R signal are set to zero (0,0) the latch is in a memory state. The output keeps the memory of a previous state. When the latch is just being powered up, the previous state may settle either to 1 or 0. In other words, the previous state is undefined.

When the set is set to zero and the reset is set to one (0, 1), the latch is in a stable low output state, and the output is set to zero.

When the set is set to one and the reset is set to zero (1,0), the latch is in a stable high output state, and the output is set to one.

When both the set and the reset signals are set to one (1,1), the latch is in a so called forbidden state. By convention the output is referred to as not allowed.

When powering up the latch of FIG. 3, both inputs S and R are initially inactive. In this case, the latch is in the memory state (0,0). The latch will settle its output either in the low state 0 or the high state 1. Assuming that the first gate 305 and the second gate 310 are identical, there is a 50% probability that the latch output will set to one and a 50% probability that the latch output will set to zero. Hence the latch settles to an undefined state, and keeps this undefined state in memory.

Let's consider first a scenario in which the latch powers up in the low state (0). If a power failure occurs, the latch would receive an input S=1 via panic_lvl signal 225. In this case, the output of the latch would set to 1.

Let's now consider a scenario in which the latch powers up in the high state (1). If a power failure occurs, the latch would receive an input S=1 via panic_lvl signal 225. However, in this case the output of the latch would remain set to 1.

Therefore, since the power up state of the latch present in the second domain is undefined, one cannot rely on the output of the latch to deduce whether a power failure in the first domain has occurred or not.

What is required is a system which guarantees that the latch will power up from the second domain (battery domain) in the low state (0). In this case a past power failure that occurred in the first domain (Vdd domain) will show as the output of the latch changes from 0 to 1 upon restart of the first domain.

Figure 4:
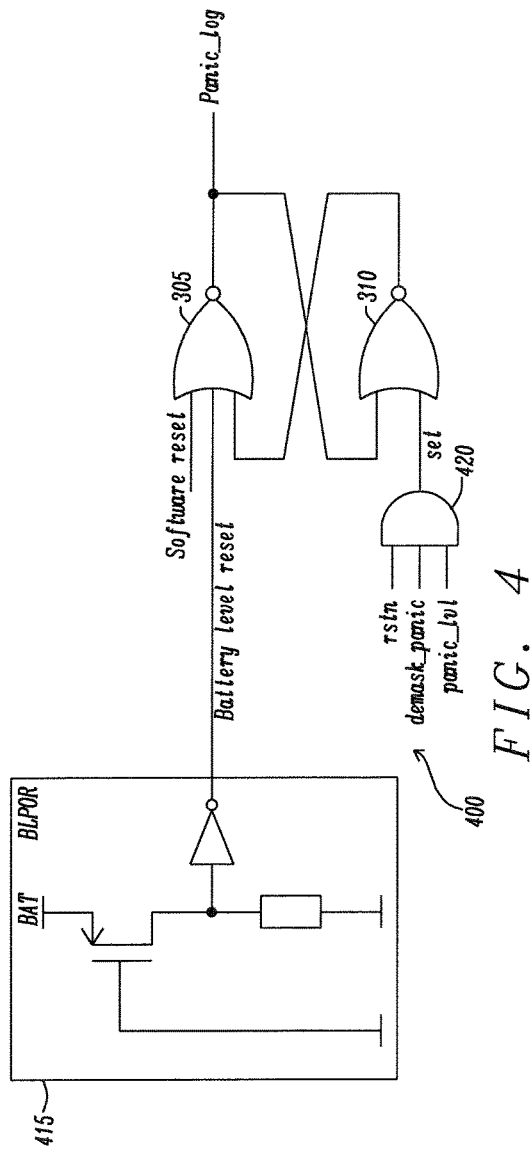
FIG. 4 is a diagram of a memory circuit.

FIG. 4 illustrates an example of a memory circuit 400 for use with the power system of FIG. 1. The memory circuit 400 is based on a latch as described in FIG. 3. In this case the latch includes a first logic gate 305 and a second logic gate 310. The first logic gate 305 has three inputs and one output for outputting the panic_log signal 235. The second logic gate 310 has two inputs and one output. The output of the first logic gate is connected to one of the two inputs of the second logic gate 310, and the output of the second logic gate 310 is connected to one of the three inputs of the first logic gate 305. The remaining two inputs of the first logic gate are adapted to receive a software reset signal and a battery level reset signal respectively. The remaining input of the second logic gate is adapted to receive a set signal.

The battery level reset signal is provided by a battery level power on reset BLPOR generator 415. The set signal is provided via an AND gate 420. For example, the AND gate 420 may have three inputs for receiving the reset signal 215, the demask_panic signal 230 and the panic_lvl signal 225 respectively. The AND gate 420 has one output for outputting the set signal.

In operation, at time t=t1 the reset signal 215, the demask_panic signal 230 and the panic_lvl signal 225 are all set to the logic value 0, as shown in FIG. 2. Since an AND gate returns a value of one only if all the inputs are one, the output of the AND gate 420 is therefore zero.

The latch is either reset using the battery level reset signal coming from the BLPOR generator 415 or using the software reset signal which comes from the first domain powered by Vdd.

Therefore, upon start up at time t1, the latch circuit has a set signal set to zero and a reset signal set to one. As a result, the output signal of the latch, the panic_log signal, is set to zero. This prevents any erroneous loading of a logic one, associated with a false assertion of a power failure, which could otherwise occur with a 50% probability. However, the battery level power on reset 415 requires a significant die area. In addition, once the battery has reached its maximum voltage value, the power on reset consumes current that flows through its resistance. The resistance of the power on reset would need to be very large in order to limit the current consumption to a level in the region of a few 100 nA in OFF-mode.

Figure 5:
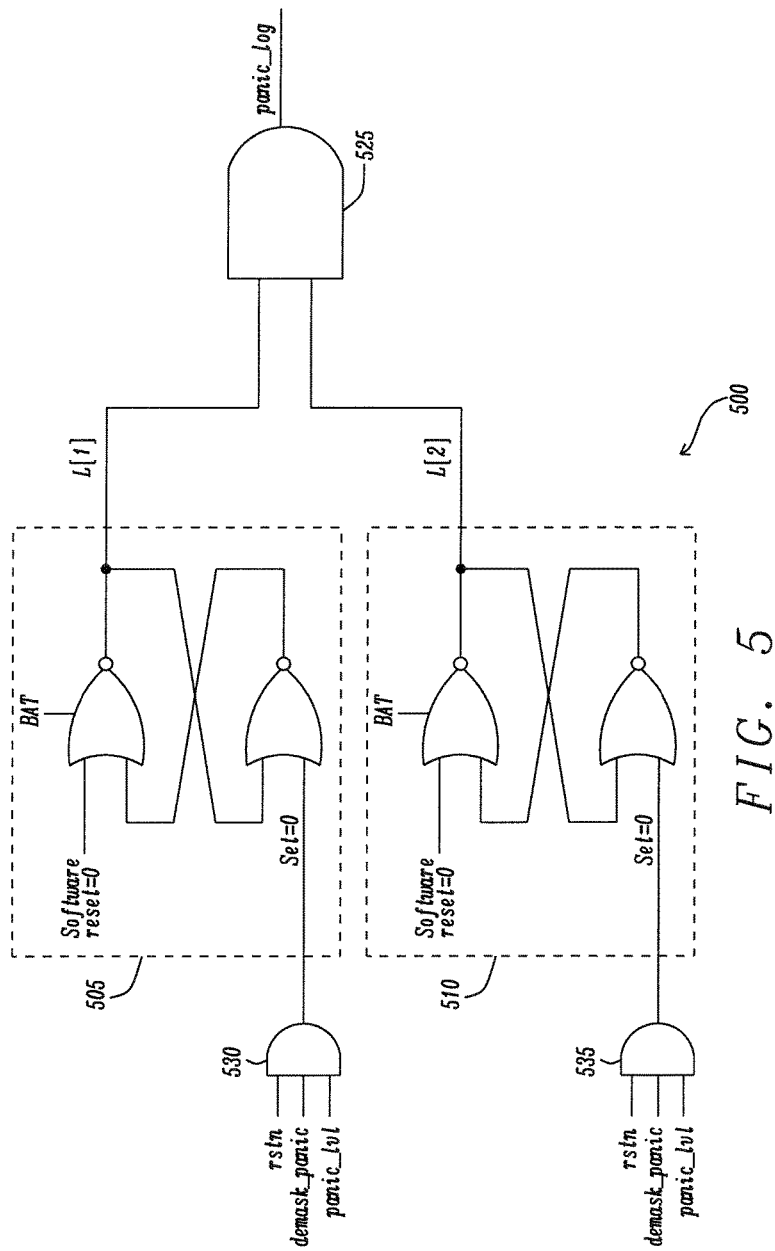
FIG. 5 is a diagram of another memory circuit.

FIG. 5 illustrates another memory circuit 500, provided by two memory elements 505, and 510 and a logic gate 525. In an exemplary embodiment, the memory elements 505 and 510 are latches, and the logic gate 525 is an AND gate. The output of the first latch, L[1], is connected to a first input of the AND gate 525 and the output of the second latch, L[2], is connected to a second input of the AND gate 525.

In operation, after the battery powers up, the output L[1] of the latch 505 has an equal probability of taking the logic value zero or one. Similarly the output L[2] of the latch 510 has also an equal probability of taking the logic value zero or one. As a result there is a 25% probability of obtaining the output combination (L[1],L[2])=(1,1); and a 75% probability of obtaining any other output combination.

If (L[1], L[2])=(1,1), the output of the AND gate 525, Panic_log, takes the logic value 1. The combination (L[1], L[2])=(1,1) is referred to the unwanted combination or unwanted code. If (L[1], L[2])=(1,0), (0,1), or (0,0), the output of the AND gate 525 takes the logic value 0.

Figure 6:
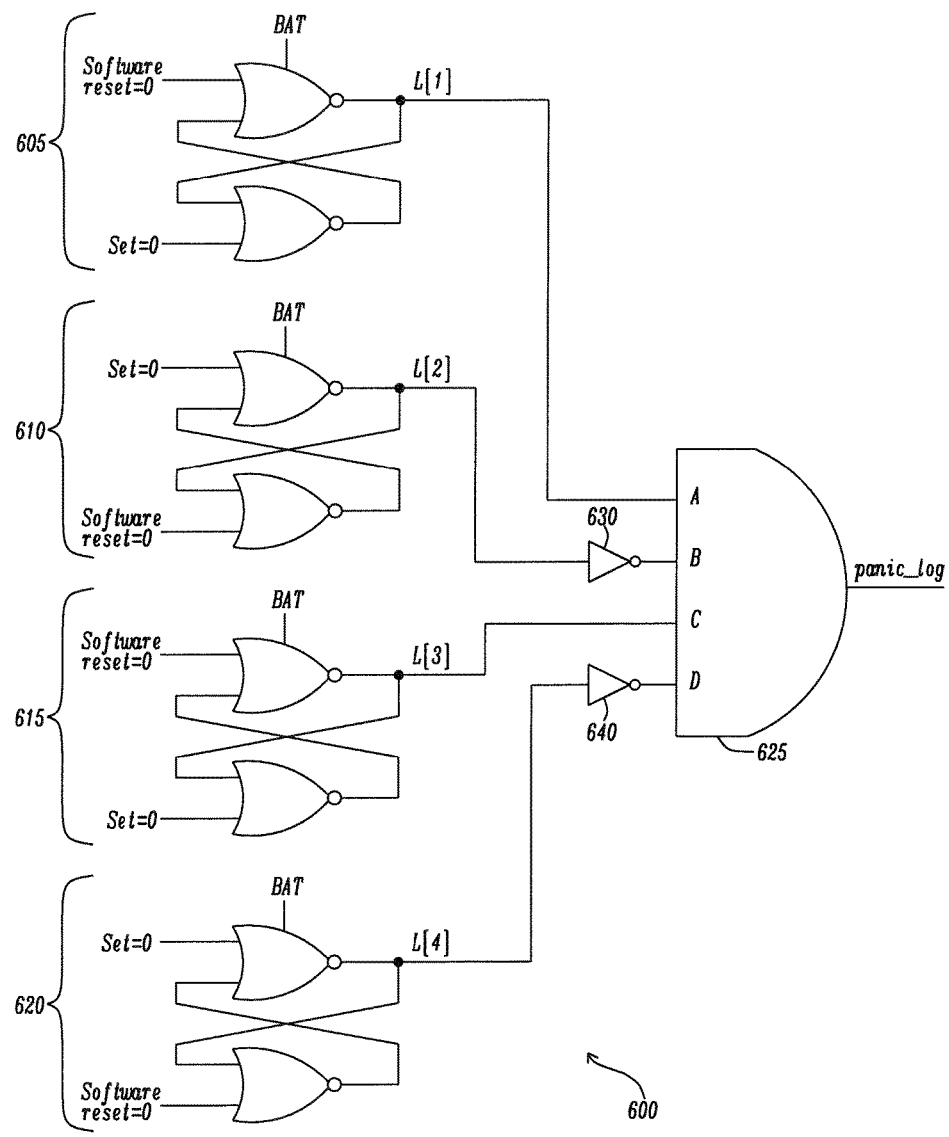
FIG. 6 is a diagram of yet another memory circuit.

FIG. 6 illustrates another memory circuit 600 provided by four memory elements 605, 610, 615, and 620 and a logic gate 625. In an exemplary embodiment, the memory elements 605, 610, 615 and 620 are four latches identical to the latch 505 of FIG. 5. The logic gate 625 is an AND gate provided with four inputs A, B, C, D and one output for outputting the panic_log signal. Each input B and D is provided with an inverter gate 630, and 640 respectively. Hence inputs B and D are inverted inputs and inputs A and C are non-inverted inputs. The inputs A, B, C and D are adapted to receive the outputs L[1], L[2], L[3], L[4] of the memory elements 605, 610, 615 and 620 respectively.

The latch 605 receives the software reset signal at its first input and the set signal at its second input. The same configuration is applied for the latch 615. In contrast, the latch 610 receives the set signal at its first input and the software reset signal at its second input. The same configuration is applied for the latch 620.

In operation, when the battery starts powering up the latch, the output L[1] of the latch 605 has an equal probability of taking the logic value zero or one. Similarly the outputs L[2], L[3], L[4] of latches 610, 615 and 620 have also an equal probability of taking the logic value zero or one.

As a result, when the output combination (L[1], L[2], L[3], L[4])=(1,0,1,0); the output of the AND gate 625, panic_log, is one. For any other output combination, the output of the AND gate 625 is zero.

In this case, there is a one chance in $2^4$, corresponding to a probability of 6.25%, of obtaining the unwanted output combination (L[1], L[2], L[3], L[4])=(1,0,1,0) leading to a panic_log of one. This means that there is a $1-\frac{1}{16}$ chance or 93.75% probability, that the panic_log will take the value zero when the battery starts powering up the latch.

When a power failure occurs, Set=1 is applied on the memory circuit, which loads the unwanted code 1010. In this case, the output of AND gate 625 takes the logic value of one, and is stored in the battery domain 110. A Software Reset is then used to set the binary complement of the combination and returns the panic_log signal to the zero logic value.

This concept can be extended to any number N of memory elements for example by implementing N latches and combining their outputs with an AND gate provided with N inputs adapted to generate a logic value of one for a single unwanted combination of latch output values. In this case, there is a $(1-\frac{1}{2}^N)$ chance to get a panic_log signal having a zero logic value at a time when the battery starts powering up the latch.

For example, if N=20, the panic_log signal will be set to a logic value of zero upon battery plug-in with a probability of 99.9999%.

In practice, if the latches present in the circuit are physically substantially identical, they are likely to settle in a correlated fashion, either in the high stable state (1) or in the low stable state (0). Latches may be physically identical because they have been manufactured using a same method of fabrication and/or because they belong to a same wafer. For example, for a first set of 10 latches, the output combination may be 0001000100 (correlation around 0), and for a second set of 10 latches the output combination may be 1111011111 (correlation around 1).

Therefore, since the latches have correlated outputs that tend to settle preferably in one particular state, the probability of obtaining an output combination that alternates ones and zeros (010101010101 . . . ) is very small. For N latches this probability is much lower than $\frac{1}{2}^n$. For this reason, a preferred unwanted combination for the memory circuit (i.e a code resulting in a panic_log signal=1) is an alternate code such as 0101010 . . . or 1010101 . . . .

To achieve this, the software reset signal and the set signal are applied to all the memory elements, to set either 1 or 0 depending on the memory element.

For example, a first latch receives the software reset signal at its first input and the set signal at its second input. A second latch receives the set signal at its first input and the software reset signal at its second input. A third latch receives the software reset signal at its first input and the set signal at its second input. This sequence can be applied alternatively to N latches.

Compared with the memory circuit of FIG. 4, the circuits of FIGS. 5 and 6 do not necessitate a power on reset. This means that the memory circuit consumes less energy. In addition, the memory circuits occupy less die area.

For example, a circuit with N=20 memory elements would be twice as small compared to a BLPOR circuit working with 20 MegOhms of resistance in terms of die area. Such a circuit would consume no energy, while the BLPOR circuit would consume 200 nA at V(BAT)=4.0V.

For ultra-low power domains, consuming less than 50 nA, a circuit with N=20 memory elements would be eight times smaller in terms of die area, compared to an equivalent circuit based on FIG. 4.

The memory circuits of the present disclosure have been described using latches as memory elements. Other memory elements may be used such as flip-flops. However, in this case the memory circuit would occupy a larger die area.

The memory circuits of the present disclosure have been described with latches based on standard logic gates, such as NOR gates. However other types of latches or flip flop may be designed. For example, a latch or a flip flop may be designed such that when operating in a metastable state, the latch or flip flop tends to settle its output to a state opposite of a chosen unwanted state.

A skilled person will therefore appreciate that variations of the disclosed arrangements are possible without departing from the disclosure. Accordingly, the above description of the specific embodiment is made by way of example only and not for the purposes of limitation. It will be clear to the skilled person that minor modifications may be made without significant changes to the operation described.

What is claimed is:

1. A memory circuit comprising
   an input to receive a logic signal, and an output to output an output logic value; and
   a plurality of logic elements, the plurality of logic elements being arranged such that, upon powering the memory circuit, the output logic value has a greater probability of settling to a first logic value than a second logic value.

2. The memory circuit as claimed in claim 1, wherein the plurality of logic elements form at least one memory element, the memory element comprising a first input, and an output to output a memory element logic value; and wherein the memory element is operable between a first state in which the memory element logic value is zero and a second state in which the memory element logic value is one.

3. The memory circuit as claimed in claim 2, comprising
a plurality of memory elements; and
a logic gate comprising a plurality of inputs to receive the outputs of the plurality of memory elements and an output to output the output logic value.

4. The memory circuit as claimed in claim 3, wherein each one of the plurality of memory elements comprises a second input.

5. The memory circuit as claimed in claim 4, wherein the first input of a first memory element among the plurality of memory elements, is adapted to receive the logic signal, and wherein the second input of the first memory element is adapted to receive a reset signal; and wherein the first input of a second memory element among the plurality of memory elements, is adapted to receive the reset signal, and wherein the second input of the second memory element is adapted to receive the logic signal.

6. The memory circuit as claimed in claim 5, wherein the logic gate comprises a least one inverted input among the plurality of inputs; and wherein the output of the first memory element is connected to a non-inverted input of the logic gate and wherein the output of the second memory element is connected to an inverted input of the logic gate.

7. The memory circuit as claimed in claim 6, wherein half of the plurality of inputs of the logic gate are inverted inputs and half of the plurality of inputs of the logic gate are non-inverted inputs.

8. The memory circuit as claimed in claim 3, wherein the logic gate comprises an AND gate.

9. The memory circuit as claimed in claim 3, wherein the memory elements are substantially identical.

10. The memory circuit as claimed in claim 2, wherein the memory element comprises at least one of a latch and a flip-flop.

11. The memory circuit as claimed in claim 2, wherein a memory element is adapted such that upon power up the output of the memory element settles predominantly towards a specific logic value.

12. The memory circuit as claimed in claim 1, wherein the probability is greater than about 50%.

13. The memory circuit as claimed in claim 1, wherein the probability is greater than about 90%.

14. An integrated circuit comprising
a first domain adapted to be powered by a rail voltage, the first domain being adapted to output a logic signal upon failure of the rail voltage; and
a second domain adapted to be powered by a battery; wherein the second domain comprises a memory circuit, adapted to receive the logic signal and to output a signal based on the logic signal; wherein the memory circuit comprises
an input to receive the logic signal, and an output to output an output logic value; and
a plurality of logic elements, the plurality of logic elements being arranged such that, upon powering the memory circuit, the output logic value has a greater probability of settling to a first logic value than a second logic value.

15. The integrated circuit as claimed in claim 14, wherein the plurality of logic elements form at least one memory element, the memory element comprising a first input, and an output to output a memory element logic value; and wherein the memory element is operable between a first state in which the memory element logic value is zero and a second state in which the memory element logic value is one.

16. The integrated circuit as claimed in claim 15, wherein the memory circuit comprises a plurality of memory elements; and a logic gate comprising a plurality of inputs to receive the outputs of the plurality of memory elements and an output to output the output logic value.

17. The integrated circuit as claimed in claim 16, wherein each one of the plurality of memory elements comprises a second input.

18. The integrated circuit as claimed in claim 17, wherein the first input of a first memory element among the plurality of memory elements, is adapted to receive the logic signal, and wherein the second input of the first memory element is adapted to receive a reset signal; and wherein the first input of a second memory element among the plurality of memory elements, is adapted to receive the reset signal, and wherein the second input of the second memory element is adapted to receive the logic signal.

19. The integrated circuit as claimed in claim 18, wherein the first domain is adapted to output the reset signal.

20. The integrated circuit as claimed in claim 19, wherein the logic gate comprises a least one inverted input among the plurality of inputs; and wherein the output of the first memory element is connected to a non-inverted input of the logic gate and wherein the output of the second memory element is connected to an inverted input of the logic gate.

21. A method for providing a memory circuit comprising
an input to receive a logic signal, and an output to output an output logic value; and
a plurality of logic elements, the plurality of logic elements being arranged such that, upon powering the memory circuit, the output logic value has a greater probability of settling to a first logic value than a second logic value.

22. The method of claim 21, wherein the plurality of logic elements form at least one memory element, the memory element comprising a first input, and an output to output a memory element logic value; and wherein the memory element is operable between a first state in which the memory element logic value is zero and a second state in which the memory element logic value is one.

23. The method of claim 22, comprising
a plurality of memory elements; and
a logic gate comprising a plurality of inputs to receive the outputs of the plurality of memory elements and an output to output the output logic value.

24. The method of claim 23, wherein each one of the plurality of memory elements comprises a second input.

25. The method of claim 24, wherein the first input of a first memory element among the plurality of memory elements, is adapted to receive the logic signal, and wherein the second input of the first memory element is adapted to receive a reset signal; and wherein the first input of a second memory element among the plurality of memory elements, is adapted to receive the reset signal, and wherein the second input of the second memory element is adapted to receive the logic signal.

26. The method of claim 25, wherein the logic gate comprises a least one inverted input among the plurality of inputs; and wherein the output of the first memory element is connected to a non-inverted input of the logic gate and wherein the output of the second memory element is connected to an inverted input of the logic gate.

27. The method of claim 26, wherein half of the plurality of inputs of the logic gate are inverted inputs and half of the plurality of inputs of the logic gate are non-inverted inputs.

28. The method of claim 23, wherein the logic gate comprises an AND gate.

29. The method of claim 23, wherein the memory elements are substantially identical.

30. The method of claim 22, wherein the memory element comprises at least one of a latch and a flip-flop.

31. The method of claim 22, wherein a memory element is adapted such that upon power up the output of the memory element settles predominantly towards a specific logic value.

32. The method of claim 21, wherein the probability is greater than about 50%.

33. The method of claim 21, wherein the probability is greater than about 90%.

* * * * *